United States Patent
Vincent et al.

(10) Patent No.: US 9,257,415 B2
(45) Date of Patent: Feb. 9, 2016

(54) STACKED MICROELECTRONIC PACKAGES HAVING SIDEWALL CONDUCTORS AND METHODS FOR THE FABRICATION THEREOF

(71) Applicants: Michael B. Vincent, Chandler, AZ (US); Scott M. Hayes, Chandler, AZ (US); Jason R. Wright, Chandler, AZ (US); Zhiwei Gong, Chandler, AZ (US)

(72) Inventors: Michael B. Vincent, Chandler, AZ (US); Scott M. Hayes, Chandler, AZ (US); Jason R. Wright, Chandler, AZ (US); Zhiwei Gong, Chandler, AZ (US)

(73) Assignee: FREESCALE SEMICONDUCTOR INC., Austin, TX (US)

(*) Notice: Subject to any disclaimer, the term of this patent is extended or adjusted under 35 U.S.C. 154(b) by 0 days.

(21) Appl. No.: 14/706,359

(22) Filed: May 7, 2015

(65) Prior Publication Data
US 2015/0243635 A1  Aug. 27, 2015

Related U.S. Application Data

(62) Division of application No. 13/591,990, filed on Aug. 22, 2012, now Pat. No. 9,064,977.

(51) Int. Cl.
*H01L 23/00* (2006.01)
*H01L 25/065* (2006.01)
*H01L 23/498* (2006.01)
(Continued)

(52) U.S. Cl.
CPC ........ *H01L 25/0657* (2013.01); *H01L 21/4853* (2013.01); *H01L 21/561* (2013.01); *H01L 23/3107* (2013.01); *H01L 23/3128* (2013.01); *H01L 23/49805* (2013.01); *H01L 23/49811* (2013.01); *H01L 23/5389* (2013.01); *H01L 24/19* (2013.01); *H01L 24/96* (2013.01); *H01L 25/105* (2013.01); *H01L 25/50* (2013.01); *H01L 25/03* (2013.01); *H01L 2225/06551* (2013.01); *H01L 2225/1035* (2013.01);
(Continued)

(58) Field of Classification Search
CPC .................................... H01L 25/0657
USPC ......................................... 257/777
See application file for complete search history.

(56) References Cited

U.S. PATENT DOCUMENTS

| | | | |
|---|---|---|---|
| 6,674,159 B1 | 1/2004 | Peterson | |
| 7,741,156 B2 * | 6/2010 | Pagaila et al. | 438/113 |

(Continued)

OTHER PUBLICATIONS

USPTO, Notice of Allowance and Fee(s) Due for U.S. Appl. No. 13/591,924, mailed May 19, 2015.
(Continued)

*Primary Examiner* — Edward Wojciechowicz
(74) *Attorney, Agent, or Firm* — Ingrassia Fisher & Lorenz, P.C.

(57) ABSTRACT

Embodiments of a method for fabricating stacked microelectronic packages are provided, as are embodiments of stacked microelectronic packages. In one embodiment, the method includes producing a partially-completed stacked microelectronic package including a package body having a vertical package sidewall, a plurality of microelectronic devices embedded within the package body, and package edge conductors electrically coupled to the plurality of microelectronic devices and extending to the vertical package sidewall. A flowable conductive material is applied on the vertical package sidewall and contacts the package edge conductors. Selected portions of the flowable conductive material are then removed to define, at least in part, electrically-isolated sidewall conductors electrically coupled to different ones of the package edge conductors.

20 Claims, 7 Drawing Sheets

(51) Int. Cl.
*H01L 23/538* (2006.01)
*H01L 25/10* (2006.01)
*H01L 23/31* (2006.01)
*H01L 21/56* (2006.01)
*H01L 21/48* (2006.01)
*H01L 25/00* (2006.01)
*H01L 25/03* (2006.01)

(52) U.S. Cl.
CPC .................. *H01L 2225/1064* (2013.01); *H01L 2924/12042* (2013.01); *H01L 2924/1461* (2013.01)

(56) References Cited

U.S. PATENT DOCUMENTS

| | | |
|---|---|---|
| 9,025,340 B2 | 5/2015 | Wright et al. |
| 9,036,363 B2 | 5/2015 | Vincent et al. |
| 9,064,977 B2 | 6/2015 | Gong et al. |
| 9,093,457 B2 | 7/2015 | Gong et al. |
| 2011/0304011 A1 | 12/2011 | Lee |
| 2012/0313209 A1 | 12/2012 | Oganesian |
| 2014/0054783 A1 | 2/2014 | Gong et al. |
| 2014/0264945 A1 | 9/2014 | Yap et al. |
| 2014/0353840 A1 | 12/2014 | Yap et al. |
| 2015/0162309 A1 | 6/2015 | Vincent et al. |
| 2015/0162310 A1 | 6/2015 | Vincent et al. |

OTHER PUBLICATIONS

Non-Final Office Action mailed Sep. 3, 2015 for U.S. Appl. No. 13/906,621, 14 pages.
Final Office Action mailed Sep. 4, 2015 for U.S. Appl. No. 14/097,459, 10 pages.
Notice of Allowance mailed Oct. 8, 2015 for U.S. Appl. No. 14/097,424, 9 pages.
Final Office Action mailed Aug. 11, 2015 for U.S. Appl. No. 13/829,737, 11 pages.
Final Office Action mailed May 12, 2015 for U.S. Appl. No. 13/906,621, 11 pages.
U.S. Appl. No. 14/573,519, filed Dec. 17, 2014, entitled "Microelectronic Devices with Mutli-Layer Package Surface Conductors and Methods of Their Fabrication".

\* cited by examiner

STACKED MICROELECTRONIC PACKAGES HAVING SIDEWALL CONDUCTORS AND METHODS FOR THE FABRICATION THEREOF

CROSS-REFERENCE TO RELATED APPLICATIONS

This application a divisional of co-pending U.S. application Ser. No. 13/591,990, filed Feb. 17, 2015; and relates to the following co-pending applications, each of which is hereby incorporated by reference: U.S. application Ser. No. 13/591,924, filed Aug. 22, 2012, and U.S. application Ser. No. 13/591,969, filed Aug. 22, 2012.

TECHNICAL FIELD

Embodiments of the present invention relate generally to microelectronic packaging and, more particularly, to stacked microelectronic packages having sidewall conductors and methods for the fabrication thereof.

BACKGROUND

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, and other compact electronic devices. Additionally, such 3D packaging techniques enhance device performance by reducing interconnection length, and thus signal delay, between the packaged microelectronic devices. Considerable efforts have been expended in the development of so-called "Package-on-Package" or, more simply, "PoP" packaging technologies. In a conventional PoP packaging approach, vertical interconnection of the stacked microelectronic devices is performed on a package level. That is, subsequent to singulation into individual die via wafer dicing, the semiconductor die are encapsulated to produce a number of discrete die packages. The discrete die packages (also referred to as "package layers" when included within a PoP package) are then stacked and vertically interconnected to produce the completed PoP package. Emerging PoP technologies include Wire Bond (WB) Ball Grid Array (BGA) PoP, FC PoP, Thru Mold Via (TMV) FC PoP, and Redistributed Chip Package (RCP) PoP packaging approaches.

BRIEF DESCRIPTION OF THE DRAWINGS

At least one example of the present invention will hereinafter be described in conjunction with the following figures, wherein like numerals denote like elements, and.

Figure 1:
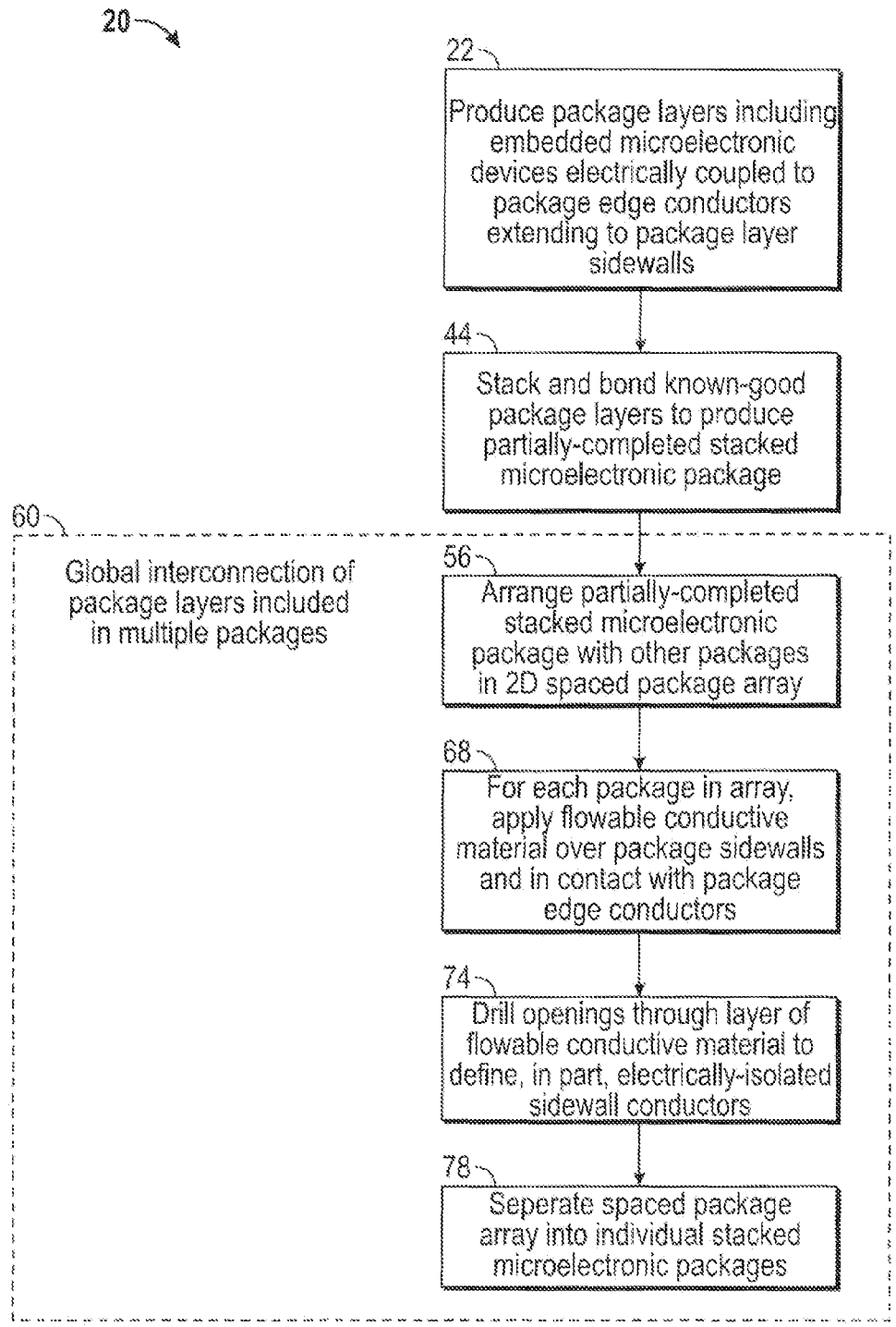
FIG. 1 is a flowchart illustrating a method for fabricating stacked microelectronic packages having sidewall interconnects, as illustrated in accordance with an exemplary and non-limiting embodiment of the present invention.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, ICs formed on semiconductor die, MEMS, passive electronic components, optical devices, and other small scale electronic devices capable of providing processing, memory, sensing, radiofrequency, optical, and actuator functionalities, to list but a few examples. The term "microelectronic package" denotes a structure or assembly containing at least one and typically two or more microelectronic devices, which may or may not be interconnected; while the term "stacked microelectronic package" refers to a microelectronic package containing at least two microelectronic devices located within different levels or overlying layers of the microelectronic package. Finally, the term "stacked microelectronic devices" is utilized to collectively refer to two or more microelectronic devices, which are located on different levels of a stacked microelectronic package, as defined above. The term "stacked microelectronic devices" thus does not require that one microelectronic device is necessarily positioned directly above or beneath another.

The following describes exemplary embodiments of a method for fabricating stacked microelectronic packages, which may overcome limitations associated with conventional PoP packaging approaches and other known packaging technologies of the type described above. Reductions in vertical package profile are achieved, at least in part, through the usage of uniquely-formed sidewall conductors, which eliminate or at least reduce the usage of BGAs or similar contact formations to interconnect overlying package layers and the microelectronic devices contained therein. Additionally or alternatively, the package sidewall conductors can be utilized to provide a convenient manner in which microelectronic devices contained within lower package layer(s) can be electrically coupled to a contact formation formed over an upper package layer. Advantageously, the sidewall conductors described herein may provide electrically-conductive paths from the package topside to the package bottom, in certain embodiments, and thereby eliminate or reduce the need for through-package vias. As a further advantage, the sidewall conductors formed pursuant to the below-described fabrication method provide superior layer-to-layer interconnectivity between package layers as compared to BGAs and similar contact formations. The below-described fabrication method can be utilized to form interconnections for a large number of stacked microelectronic packages utilizing an efficient and large scale material fill and removal process (referred to more informally as a "fill and drill process" in embodiments wherein a drilling process is utilized to remove selected portions of the electrically-conductive paste or other flowable conductive material applied on the package sidewall(s), as described in detail below). For at least these reasons, embodiments of the fabrication method described below are able to provide an efficient, cost effective, reliable, and repeatable manner in which highly dense 3D stacked microelectronic packages can be produced.

FIG. 1 is a flowchart setting-forth a method 20 for fabricating a number of stacked microelectronic packages each including two or more microelectronic devices electrically coupled to, and possibly interconnected by, a plurality of sidewall conductors formed on the package sidewalls. As shown in FIG. 1 and described in detail below, method 20 is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of stacked microelectronic packages or certain components included within the microelectronic packages are well-known and, in the interests of brevity, will only be mentioned briefly herein or will be omitted entirely without providing the well-known process details. While described below in conjunction with the manufacture of one or more exemplary stacked packages, as illustrated at different stages of completion in FIGS. 2-14, it will be appreciated that exemplary method 20 can be utilized to produce various other types of stacked microelectronic packages.

Referring to FIG. 1, exemplary method 20 commences with the production of a number of package layers (STEP 22, FIG. 1). The package layers produced during STEP 22 of method 20 are also commonly referred to as individual "packages"; however, the phrase "package layers" is utilized predominately herein to distinguish between the package layers or packages that are stacked and interconnected to produce the completed stacked microelectronic packages and the completed microelectronic packages themselves. The completed microelectronic packages produced pursuant to the below-described method are also commonly referred to as a Package-on-Package (PoP) devices or System-in-Package (SiP) devices, depending upon the particular manner in which the completed microelectronic packages are implemented. Any method suitable for fabricating a stackable package or package layer having at least one electrically-conductive element exposed through a package sidewall and electrically coupled to microelectronic device contained within the package layer can be carried-out during STEP 22 of method 20. This notwithstanding, the individual package layers are conveniently fabricated utilizing a so-called fan-out wafer level packaging (FO-WLP) approach, such as a Redistributed Chip Packaging (RCP) manufacturing process. An exemplary RCP manufacturing process suitable for producing one or all of the packages layers is described below in conjunction with FIGS. 2-5.

Figure 2:
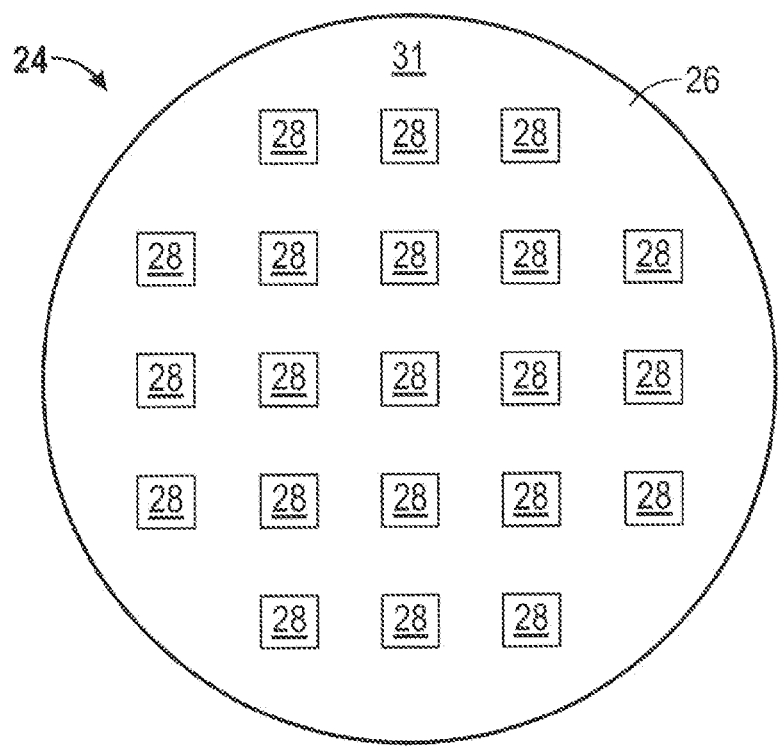
FIGS. 2-14 illustrate an exemplary stacked microelectronic package at various stages of completion and produced in accordance with the exemplary fabrication method shown in FIG. 1.

FIG. 2 is a top-down view illustrating a partially-completed microelectronic device panel 24, which may be produced utilizing an RCP process performed during STEP 22 of exemplary method 20 (FIG. 1). Exemplary RCP device panel 24 includes a panel body 26 in which a plurality of microelectronic devices 28 are embedded. Microelectronic devices 28 may be substantially identical or may instead vary in type, function, size, etc.; e.g., certain ones of devices 28 may be a first type of device (e.g., ASIC die), while others of devices 28 may be a second type of device (e.g., MEMS devices). Devices 28 are exposed through major surface 31 of panel body 26 (referred to herein as "device surface 31"). In the illustrated example, device panel 24 includes twenty one square-shaped devices 28 arranged in a grid pattern or array; however, the number of microelectronic devices, the planform dimensions of the microelectronic devices (e.g., the die shape), and the manner in which the devices are spatially distributed within panel body 26 will inevitably vary amongst embodiments. Panel body 26 is typically produced as a relatively thin, disc-shaped body or mass having a generally circular planform geometry; however, panel body 26 can be fabricated to have any desired shape and dimensions. Panel body 26 is conveniently imparted with a thickness equivalent to or slightly exceeding the maximum height of microelectronic devices 28 (i.e., the die height when devices 28 are semiconductor die) to minimize the overall vertical profile of the completed stacked microelectronic package.

RCP device panel 24 can be produced in following manner. First, microelectronic devices 28 are distributed in a desired spatial arrangement over the surface of a support substrate or carrier (not shown); e.g., devices 28 may be arranged over the carrier in a grid array of the type shown in FIG. 2. If desired, one or more release layers may also be applied or formed over the carrier's upper surface prior to positioning of microelectronic devices 28. A mold frame, which has a central cavity or opening therethrough, is positioned over the carrier and around the array of microelectronic devices 28. An encapsulant, such as a silica-filled epoxy, is then dispensed into the cavity of the mold frame and flows over microelectronic devices 28. Sufficient volume of the encapsulant is typically dispensed over microelectronic devices 28 to enable the encapsulant to flow over the uppermost or non-contact-bearing surfaces of devices 28. The encapsulant may then be solidified by, for example, an oven cure to yield a solid panel body in which microelectronic devices 28 are embedded. Panel body 26 may be rigid or flexible, depending upon the chosen encapsulant. Panel body 26 is then released from the carrier to reveal the backside of body 26 through which devices 28 are exposed; i.e., device surface 31 in the exemplary embodiment shown in FIG. 2. If desired, the front side of panel body 26 may be ground or polished to bring device panel 24 to a desired thickness prior to release of the panel body from the carrier. The foregoing example notwithstanding, panel body 26 can be produced utilizing various other known fabrication techniques including, for example, compression molding and lamination processes.

After encapsulation of microelectronic devices 28 within panel body 26, a plurality of package edge conductors is next fabricated over device surface 31 of RCP device panel 24. The term "package edge conductor," as appearing herein, refers to an electrically-conductive element, such as a metal trace, a wire, an interconnect line, a metal-filled trench, a bond pad, or the like, which is electrically coupled to a microelectronic device embedded within a package or package layer and which extends to a sidewall or edge portion of the package to contact a sidewall conductor, such as the sidewall conductors described below in conjunction with FIGS. 3-14. The package edge conductors can assume a wide variety of different forms and, in many embodiments, will consist of or include a number of electrically-conductive lines (e.g., metal traces), vias, metal plugs, and the like, which are formed in a number of dielectric layers (commonly referred to as a "build-up layers," "metal layers," or "redistribution layers" (RDLs)), and which collectively provide an electrically conductive path between an encapsulated microelectronic device and a package sidewall conductor formed on the package sidewall, as described below in conjunction with FIGS. 13 and 14.

Figure 3:
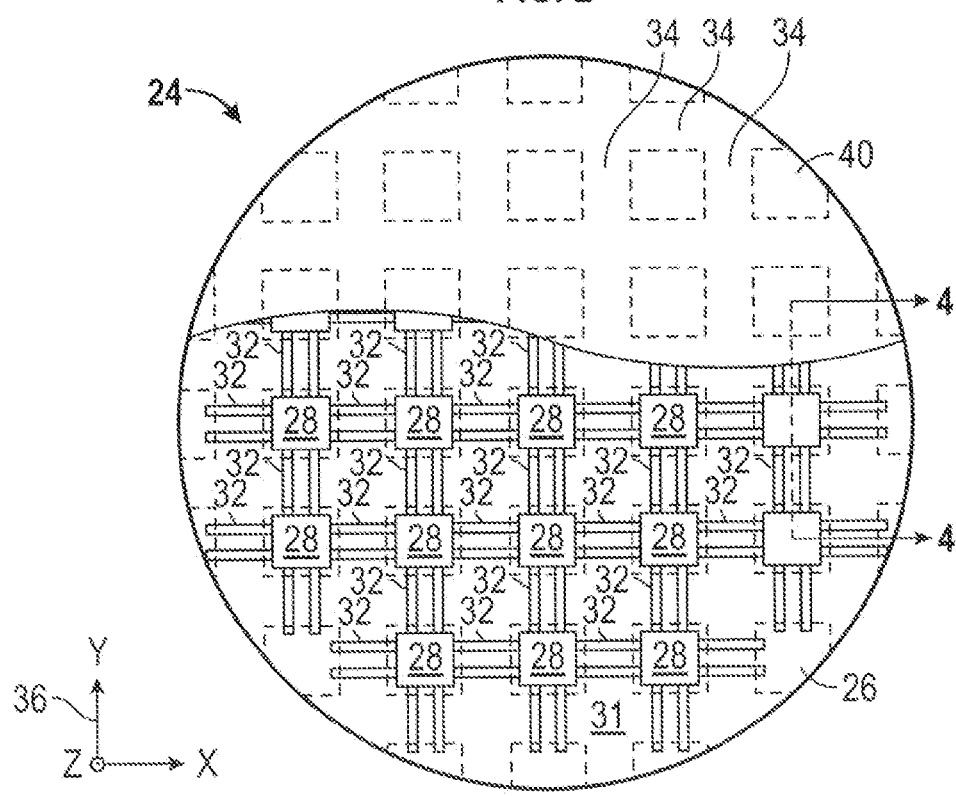
Figure 4:
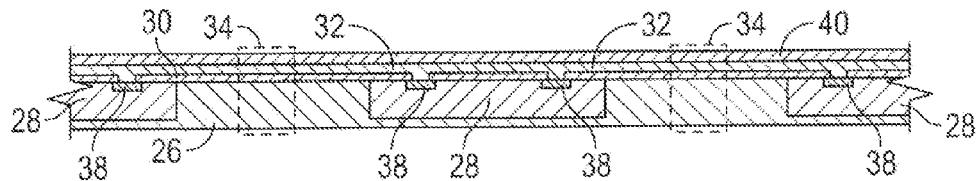

By way of non-limiting example, FIG. 3 illustrates a number of package edge conductors 32 that can be formed over device surface 31 during production of RCP device panel 24. FIG. 4 further illustrates, in greater detail, a portion of microelectronic device panel 24, as taken in cross-section along line 4-4 identified in FIG. 3. In this particular example, package edge conductors 32 assume the form of a number of interconnect lines or metal (e.g., copper) traces and are consequently referred to as "traces 32" hereafter. Traces 32 extend along a plane parallel with device surface 31 or, stated differently, along the x-y plane identified in FIG. 3 by coordinate legend 36. Traces 32 are conveniently produced utilizing bumping or wafer level packaging fabrication techniques well-known within the semiconductor industry, such as sputtering, plating, jetting, or stencil printing (e.g., of an electrically-conductive ink), to list but a few examples. Traces 32 will typically be formed in one or more layers of dielectric material 30 (shown in FIG. 4 and not shown in FIG. 3 to more clearly illustrate the positioning of microelectronic devices 28 with respect to traces 32). As may be appreciated most readily with reference to FIG. 4, package edge conductors 32 are electrically coupled to a number of landing pads or other electrical contact points 38 provided on each microelectronic device 28. Package edge conductors 32 may be electrically connected to device contact points 38 by filled vias, plated vias, metal plugs, or the like formed through the dielectric layer or layers underlying package edge conductors 32 utilizing bumping, wafer level packaging, or other known processing techniques. After formation of package edge conductors 32, one or more overlying dielectric, capping, or passivation layers 40 (partially shown in FIG. 3 and fully shown in FIG. 4) may be formed over package edge conductors 32 utilizing a spin-on coating process, printing, lamination, or another deposition technique.

Package edge conductors 32 extend from their respective microelectronic devices 28 to neighboring dicing streets 34, which surround or border each device 28 and which are generically represented in FIG. 3 by intersecting dashed columns and rows. Dicing streets 34 represent portions of device panel 24 located between and around devices 28, which lack electrically-active elements and along which the stacked microelectronic packages are divided during singulation. Dicing streets 34 are also commonly referred to as "saw streets"; however, the term "dicing streets" is used herein to emphasize that, while it is preferred that the singulation is accomplished through a mechanical sawing process, other dicing techniques can be employed to separate the microelectronic packages during singulation including, for example, laser cutting and scribing with punching. As shown in the exemplary embodiment illustrated in FIGS. 3 and 4, neighboring package edge conductors 32, which extend along aligning axes (i.e., the x- or y-axis, as identified in FIG. 3), can be formed to connect or meet within dicing streets 34 and thereby form a continuous conductive line extending between neighboring microelectronic devices 28; however, this is by no means necessary as the portions of package edge conductors 32 extending into dicing streets 34 will later be removed during singulation of device panel 24, as described below in conjunction with FIG. 5. While a single layer or level of package edge conductors or traces 32 are formed over RCP panel 24 in the example shown in FIGS. 3 and 4, multiple layers or levels of traces 32 can be formed over RCP device panel 24 in other embodiments. Furthermore, in embodiments wherein one or more of the individual package layers include multiple embedded microelectronic devices, conductors may also be formed at this juncture in the fabrication process, preferably in conjunction with the formation of package edge conductors 32, to interconnect the multiple devices included within each package layer.

Figure 5:
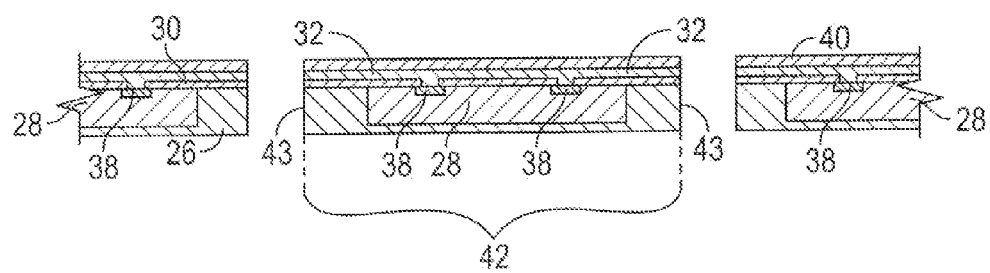

RCP device panel 24 is singulated to complete production of the package layers during STEP 22 of exemplary method 20 (FIG. 1). As previously indicated, panel singulation is preferably carried-out by mechanical sawing; however, any suitable separation process can be utilized including laser cutting and scribing with punching. In one embodiment, singulation is performed utilizing a conventional dicing saw, such as a water-cooled diamond saw. FIG. 5 illustrates, in cross-sectional view, a portion of exemplary microelectronic device panel 24 after singulation to yield a plurality of stacked microelectronic package layers 42 (only one of which is fully shown and identified in FIG. 5). Each RCP package layer 42 will typically be cut to have a rectangular shape and, therefore, four vertical package edges or sidewalls 43. As package edge conductors 32 were previously formed to extend to dicing streets 34 (now removed), package edge conductors 32 extend to and are exposed through vertical sidewalls 43 of the singulated package layers 42. Package edge conductors 32 are conveniently produced to extend to each of the four vertical package sidewalls in the below-described manner to maximize layer-to-layer connectivity of the finished packaged device; however, this is by no means necessary, and package edge conductors 32 may be fabricated to extend to one, two, three, or any other number of package sidewalls in further embodiments.

Figure 6:
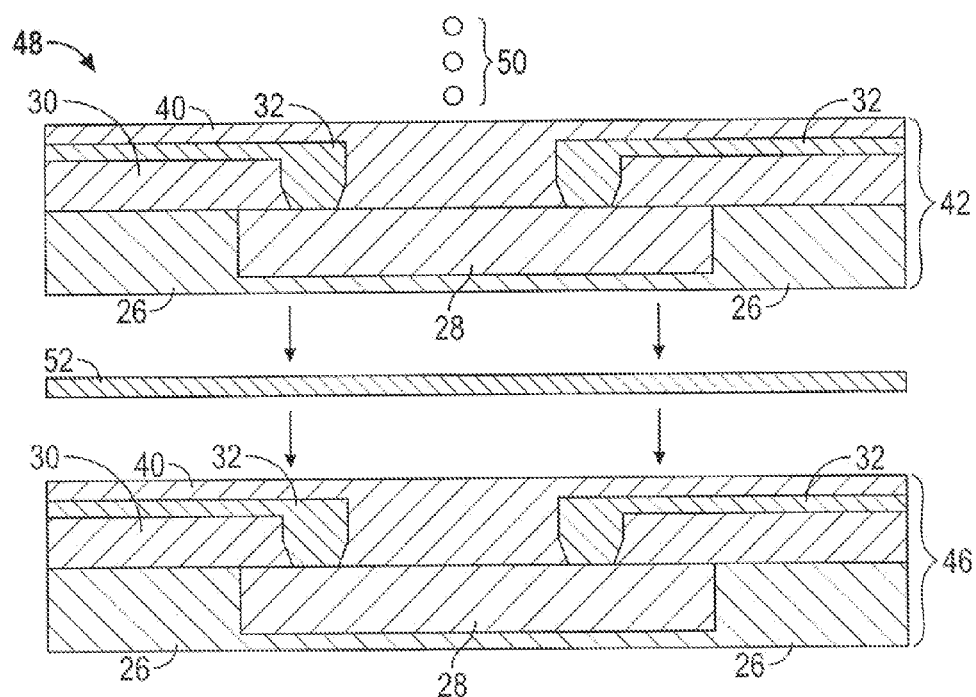
Figure 7:
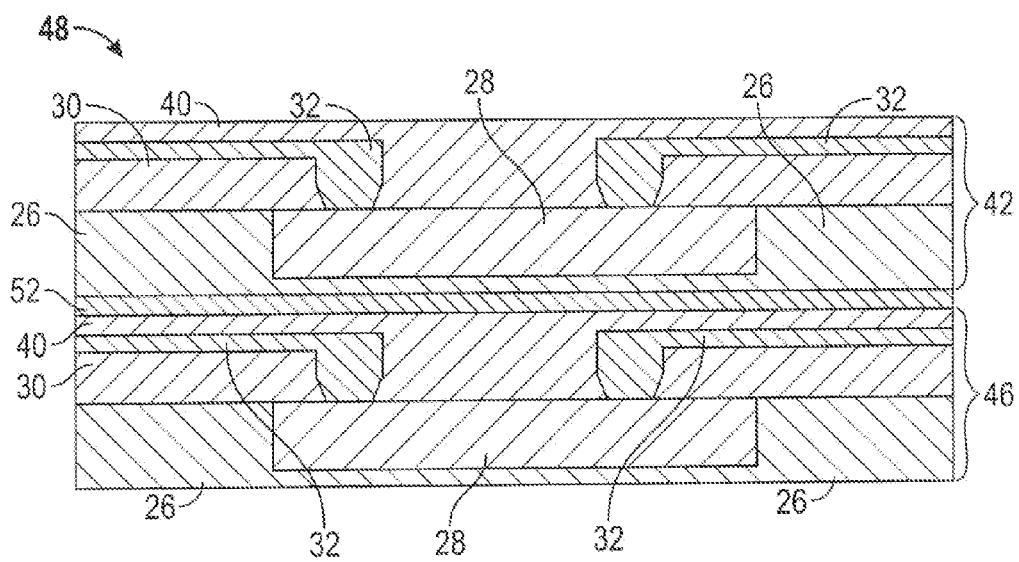

Advancing to STEP 44 of exemplary method 20 (FIG. 1), each singulated package layer 42 produced during STEP 22 is now combined with one or more additional package layers to produce partially-completed stacked microelectronic packages. Further illustrating this manufacturing step, FIGS. 6 and 7 are exploded cross-sectional and cross-sectional views, respectively, depicting an exemplary manner which RCP package layer 42 may be positioned in stacked relationship with an additional RCP package layer 46 (only a small portion of which is shown in FIGS. 6 and 7) to produce an exemplary partially-completed stacked microelectronic package 48. As indicated in FIG. 6 by ellipses 50, any practical number of additional device layers may also be included within partially-completed stacked microelectronic package 48. For convenience of explanation, RCP package layer 46 is illustrated and described as substantially identical to RCP package layer 42; e.g., as does package layer 42, package layer 46 includes a molded package layer body 26, a number of microelectronic devices 28 embedded in package layer body 26, and a plurality of package edge conductors 32 (e.g., metal traces) extending from devices 28 to the package sidewalls. In view of the illustrated orientation of microelectronic package 48, RCP package layer 42 will be referred to as "upper package layer 42" herein below, while RCP package layer 46 is referred to as "lower package layer 46." It should be understood, however, that this terminology is used for convenience of reference only, that the orientation of the completed stacked microelectronic package is arbitrary, and that the microelectronic package will often be inverted during later processing steps and/or when incorporated into a larger electronic system or device.

Package layers 42 and 46 (and any additional microelectronic device panels included within partially-completed stacked microelectronic package 48) are preferably laminated together during STEP 44 of method 20. As indicated in FIGS. 6 and 7, this may be accomplished by applying or otherwise disposing an intervening bonding layer 52 between microelectronic device package layers 42 and 46 prior to package stacking Bonding layer 52 can be an epoxy or other adhesive, which may be applied over the upper surface of lower package layer 46 and thermally cured after positioning of upper package layer 42. This example notwithstanding, any suitable bonding material or means can be utilized to bond package layers 42 and 46 together including, for example, double-sided adhesive tape. By laminating microelectronic device package layers 42 and 46 together in this manner, the relative positioning of package layers 42 and 46 and, therefore, the relative positioning of the microelectronic devices 28 embedded within package layers 42 and 46 can be maintained during processing and after singulation into discrete stacked microelectronic packages. Package layers 42 and 46, and any other package layers to be included within the stacked microelectronic packages, are advantageously tested prior to stacking to ensure that only known-good package layers are consolidated during STEP 44 of exemplary method 20 (FIG. 1).

In the exemplary embodiment illustrated in FIGS. 6 and 7, package layer 46 is positioned in a stacked relationship with at least one additional RCP package or package layer after the additional package layer has undergone singulation and, thus, been separated from the larger device panel, such as panel 24 shown in FIGS. 2 and 3. However, in further embodiments, package layer 46 may be positioned in a stacked relationship with at least one additional RCP package layer prior to singulation thereof; that is, the singulated package layer 46 and a plurality of like package layers may be stacked or positioned over a number of additional package layer that are still interconnected as a pre-singulated device panel. After stacking the singulated packages on the non-singulated device panel, and preferably after bonding the singulated packages to the panel in the above-described manner, the individual stacked microelectronic packages may then be separated by singulation of the panel using, for example, a dicing saw. This alternative fabrication technique likewise yields a plurality of partially-completed stacked microelectronic packages, such as stacked microelectronic package 48 shown in FIGS. 6 and 7. In still further embodiments, two or more device panels may be stacked, bonded, and then singulated to produce the partially-completed stacked microelectronic packages during STEP 22 of exemplary method 20 (FIG. 1). The foregoing processes are all considered to constitute the stacking of microelectronic packages, whether stacking is performed utilizing multiple singulated packages, multiple non-singulated packages in the form of multiple RCP device panels, or a combination of singulated packages and one or more device panels. Advantageously, such manufacturing techniques wherein package stacking is performed on a partial or full panel level facilitates the positioning and bonding of the stacked microelectronic packages thereby improving throughput while reducing manufacturing time and cost.

Figure 8:
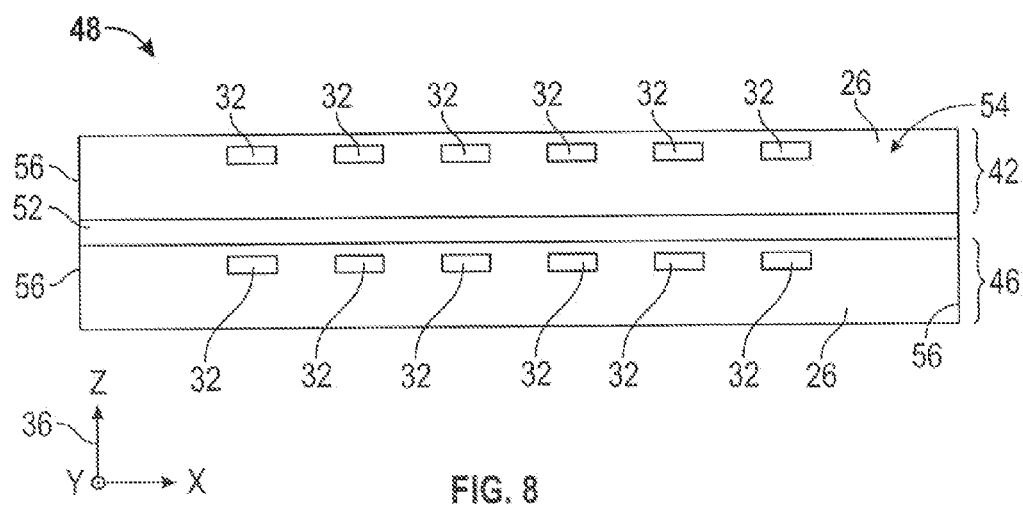

FIG. 8 is a non-cross-sectional view of stacked microelectronic package 48, as produced in accordance with the illustrated exemplary embodiment. It can be seen in FIG. 8 that microelectronic package 48 includes a package body 54 having four vertical sidewalls 56 (only one of which can be seen in FIG. 8). As should be appreciated from the foregoing description, each package layer 42 and 46 of package body 54 contains at least one microelectronic device (i.e., microelectronic device 28 shown in FIGS. 2-7), which is embedded within the molded package layer body 26. Each package layer 42 and 46 further includes package edge conductors 32, which are electrically coupled to the embedded microelectronic devices and exposed through one of the vertical package sidewalls, such as package sidewall 56 identified in FIG. 8. As the below-described package sidewall conductors will often be formed to have a generally linear shape and vertical orientation, stacked microelectronic package 56 is conveniently fabricated such that the exposed terminal end of each package edge conductor 32 included within package layer 42 generally aligns with a different exposed terminal end of a sidewall conductor 32 included within package layer 46, as taken along the centerline of package 48 or along the z-axis (identified in FIG. 8 by coordinate legend 36); however, this is not necessary in all embodiments as it is possible to form sidewall connectors having L-shaped, U-shaped, block-shaped, and other geometries interconnecting non-overlapping sidewall conductors 32, as well as sidewall connectors having non-vertical (e.g., slanted) orientations, as described below in conjunction with STEPS 74 and 78 of exemplary method 20 (FIG. 1).

Figure 9:
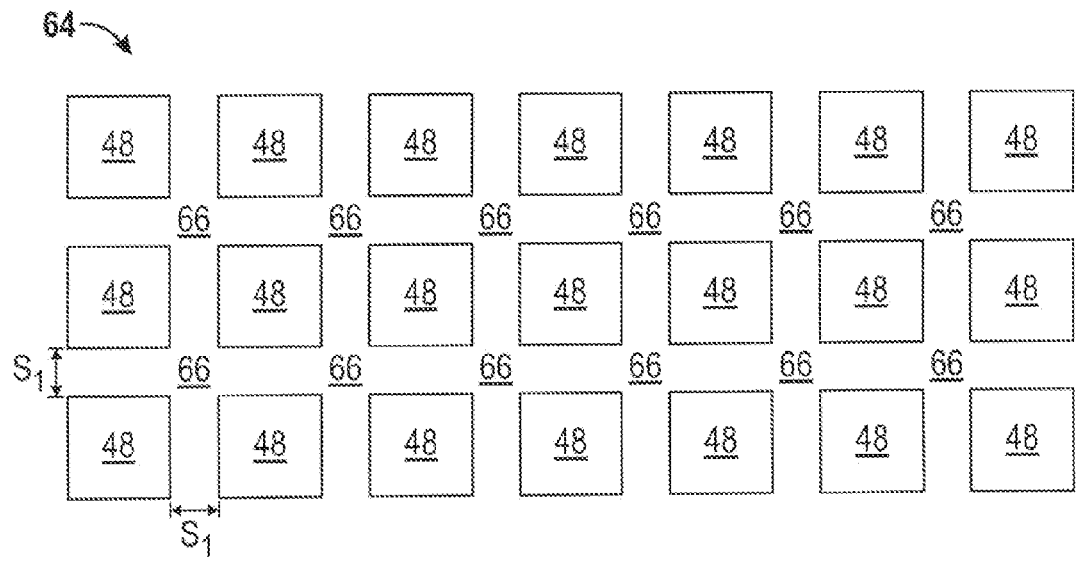

Sidewall conductors are next formed on at least one of the package sidewalls. The sidewall conductors may electrically couple different ones (typically pairs) of package edge conductors and thereby interconnect the package layers and, specifically, the microelectronic devices contained therein. Additionally or alternatively, the sidewall conductors may electrically couple the microelectronic device or devices located in lower package levels or layers to a contact formation formed over the uppermost package level or layer. For improved manufacturing efficiency, formation of the sidewall conductors is advantageously carried-out in parallel for a relatively large number of stacked microelectronic packages. In this regard, and with reference to PROCESS BLOCK 60 shown in FIG. 1, partially-completed stacked microelectronic package 48 may first be arranged with a number of other stacked microelectronic packages in a spaced package array or grouping (STEP 62, FIG. 1), such as a two dimensional grid array. An example of such a two dimensional grid array 64 including a number of stacked microelectronic packages 48 is shown in FIG. 9. The illustrated grid array is referred to as "spaced" to indicate that columns and rows of neighboring packages 48 are spaced apart by a predetermined package-to-package spacing (identified in FIG. 9 as "$S_1$"). The spacing between adjacent microelectronic packages 48 defines a lattice of intersecting lanes or alleys 66 with each alley bordered by the vertical sidewalls of aligned packages. The spacing between stacked microelectronic packages 48 can be maintained utilizing a fixture (not shown), such as a carrier having relatively shallow conformal depressions or alignment features for positively registering packages 48 in their desired positions. In one implementation, a whole, tested panel is utilized as the array fixture. While illustrated as a grid array in FIG. 9, the spaced package array can assume any spatial configuration suitable for allowing the application of a flowable conductive material or electrically-conductive adhesive on the package sidewalls, as described below in conjunction with FIGS. 10 and 11.

Next, at STEP 68 of exemplary method 20 (FIG. 1), a flowable conductive material or electrically-conductive adhesive is applied onto package sidewalls 56 so as to contact the package edge conductors 32 (FIGS. 3-8) of each partially-fabricated package included in spaced package array 64. As utilized herein, the term "flowable conductive material" denotes an electrically-conductive material that is sufficiently flowable under process conditions to permit bulk inflow into and at least partial filling of alleys 66 between neighboring packages 48. A non-exhaustive list of suitable flowable conductive materials includes nanoparticle-filled inks, electrically-conductive polymers, solder pastes, solder-filled adhesives and metal-containing adhesives or epoxies, such as silver-, nickel-, and copper-filled epoxies (collectively referred to herein as "electrically-conductive pastes"). Suitable flowable conductive materials also include low melt point metals and alloys lacking resins or fluxes and having melting points below 300° C. including, but not limited to, indium and bismuth. The term "flowable conductive material" expressly excludes metals and alloys, such as copper and tungsten, deposited using physical vapor deposition (PVD), chemical vapor deposition (CVD), and similar vapor deposition processes. Whether the sidewall conductors are fabricated from a flowable conductive material, as defined above, or from a plated metal film results in a structural difference in the microstructure of the sidewall conductors (e.g., whether the microstructure is columnar), which can be observed utilizing a scanning electron microscope or similar inspection tool. While a sufficient quantity of the conductive material can be applied to completely fill alleys 66 during STEP 68 of exemplary method 20, this is not necessary as the flowable conductive material need only cover the areas of package sidewalls 56 through which the terminal ends of package edge conductors 32 are exposed. Thus, depending upon the particular deposition technique employed, the flowable conductive material can be selectively or judiciously deposited as a number of discrete masses, globules, or bodies during STEP 68, as described more fully below in conjunction with FIGS. 10 and 11.

Figure 10:
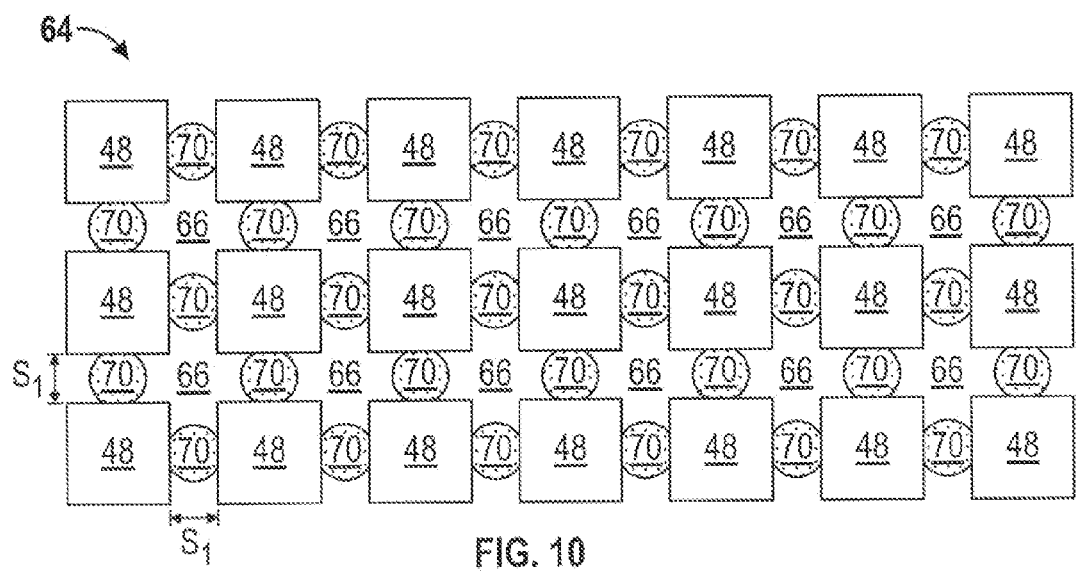
Figure 11:
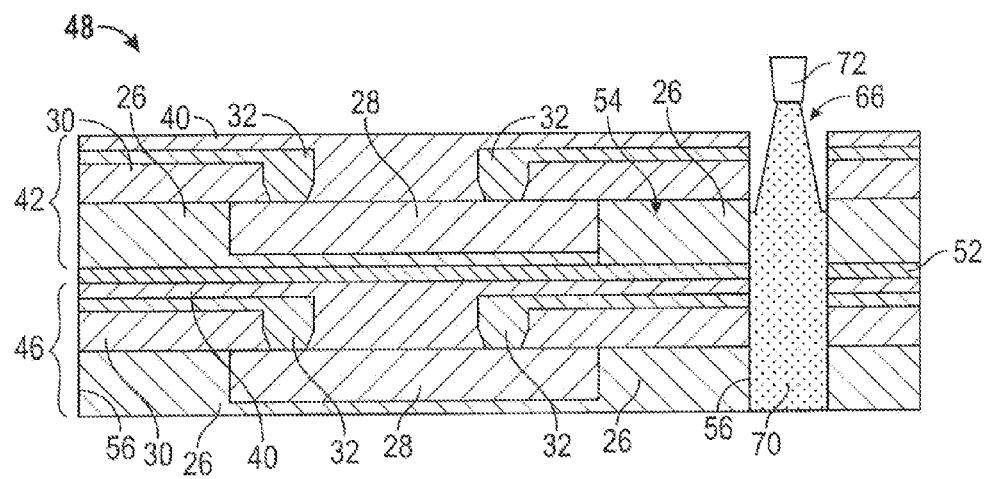

FIG. 10 illustrates spaced package array 64 after multiple bodies 70 of an electrically-conductive paste or other flowable conductive material have been selectively deposited into alleys 66 and on vertical sidewalls 56 between neighboring packages 48; and FIG. 11 illustrates, in a more detailed cross-sectional view, the application of one body 70 of flowable conductive material between neighboring packages 48. Different application techniques can be employed to direct the flowable conductive material into alleys 66 including, but not limited to, stencil or screen printing, squeegee application, needle dispensing, jetting, and the like. In the illustrated example, and referring specifically to FIG. 11, a needle having a nozzle 72 is utilized to dispense flowable conductive material 70 between spaced packages 48 and on vertical package sidewalls 56 through which the package edge conductors 32 are exposed. Bodies of conductive material 70 are deposited into alleys 66 at selected locations such that neighboring conducive bodies are spaced apart by intervening air gaps or unfilled areas of alleys 66. In another embodiment, a silver-filled epoxy is deposited into alleys 66 in sufficient quantity to fill each alley 66 in its substantial entirety utilizing a screen printing technique. Although not shown in FIG. 11 for clarity, flowable conductive material is also preferably applied around the periphery of spaced package array 64 to allow interconnection on all four sides of the partially-completed stacked microelectronic packages making-up the outermost columns and rows of array 64. After deposition of the electrically-conductive material into alleys 66 and on package sidewalls 56, a thermal cure may be performed, if needed. If performed, the parameters of the thermal cure will vary depending upon the deposited volume and the particular composition of electrically-conductive material deposited into alleys 66; however, to provide a generalized and non-limiting example in an embodiment wherein a metal-filled epoxy is utilized, an oven cure may be performed at a temperature of about 80° C. to about 200° C. for a duration of approximately one half hour to about three hours.

Figure 12:
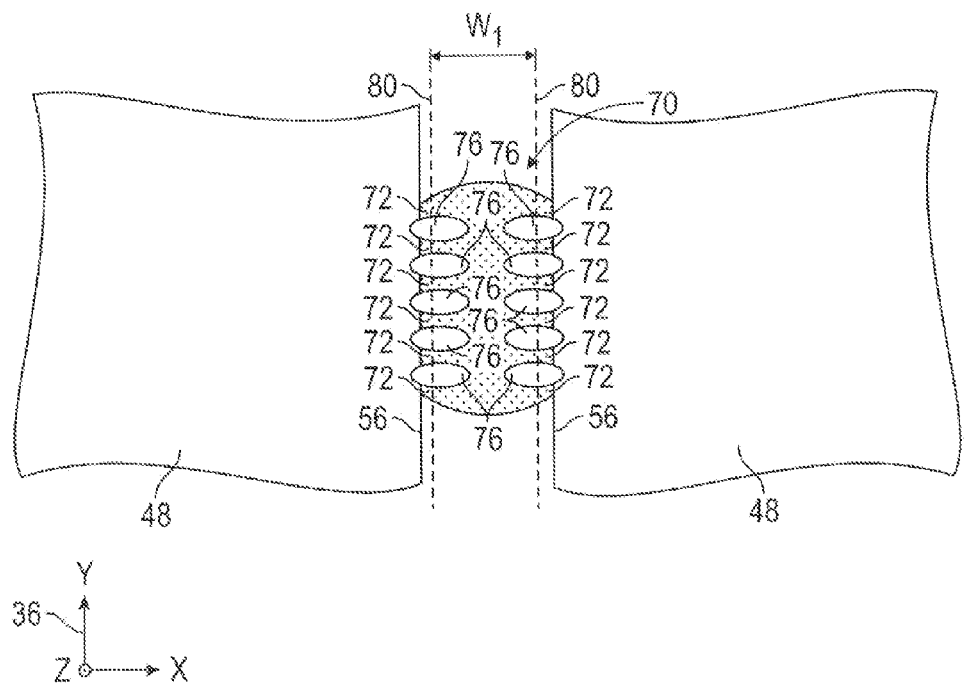

Continuing with exemplary fabrication method 20 (FIG. 1), selected portions of the electrically-conductive material 70 are next removed to define, in part, a number of electrically-isolated sidewall conductors (STEP 74, FIG. 1). FIG. 12 illustrates, from a top-down perspective, a portion of spaced package array 64 illustrating one manner in which a body of flowable conductive material 70 deposited between two neighboring packages 48 may appear after patterning. As can be seen in FIG. 12, vertical columns of electrically-conductive material 70 have been removed to yield two series of vertical holes, tunnels, or openings 76, which are linearly spaced apart along the x- and y-axes (identified in FIG. 12 by axes legend 36). Openings 76 define, in part, a plurality of electrically-isolated sidewall conductors 72, which are later fully defined by singulation or separation of spaced package array 64 (described below in conjunction with STEP 78 of method 20). Each opening 76 is formed adjacent and extends to a package sidewall 56. Small portions of the package body adjacent each flowable conductive material body 70 may also be removed during STEP 74 to ensure complete removal of the electrically-conductive material separating neighboring conductors 72. Each opening 76 further extends outwardly away from the package sidewall and into the area of conductor body 70 that is later removed during array singulation (described below and represented in FIG. 12 by dashed lines 80). To provide the desired electrical isolation between adjacent sidewall conductors, each opening 76 is also formed to extend entirely through the body of electrically-conductive material 70. In embodiments wherein openings 76 are formed as vertically-oriented holes or tunnels, as illustrated in FIG. 12, each opening 76 can extend entirely through the body of electrically-conductive material 70, as taken in a vertical direction along the z-axis identified by axes legend 36 or as taken through the thickness of partially-fabricated microelectronic package 48. While two rows of openings 76 are formed in the body of electrically-conductive material 70 in the illustrated example with each opening having a generally overall shaped planform geometry, the number, disposition, and shape of openings 76 may vary amongst embodiments, providing that openings 76 provide the desired electrical isolation between neighboring sidewall conductors 72, as described more fully below. The foregoing material removal process thus leaves portions of the previously-deposited conductive material in contact with terminal ends of the sidewall conductors exposed through the vertical package sidewall.

Openings 76 can be formed during STEP 74 of exemplary method 20 (FIG. 1) utilizing a mechanical drilling, laser ablation, routing, or another suitable material removal process, all of which are considered forms of drilling in the context of the present application. In one implementation, laser ablation is employed to remove selected portions or vertical columns of material 70 and produce openings 76 by drilling down into the bodies of conductive material 70 from the top side or upper surface of package array 64. Laser ablation can be performed with a standard UV or $CO_2$ laser drilling machine. Notably, in embodiments wherein the electrically-conductive material deposited into trenches 54 (FIGS. 7 and 8) is a flowable conductive material of the type described above, such as an electrically-conductive paste, the laser ablation process can be carried-out at significantly lower energies (e.g., reduced wattages and/or pulse frequencies) than are typically required to remove metal film deposited utilizing CVD, PVD, or similar vapor deposition process. By employing such a low energy laser ablation process to form openings 76, undesired heat transfer to the surrounding portions of stacked microelectronic packages 48 can be avoided, which could otherwise damage or degrade packages 48 by, for example, accelerating delamination and separation of the stacked package layers.

Figure 13:
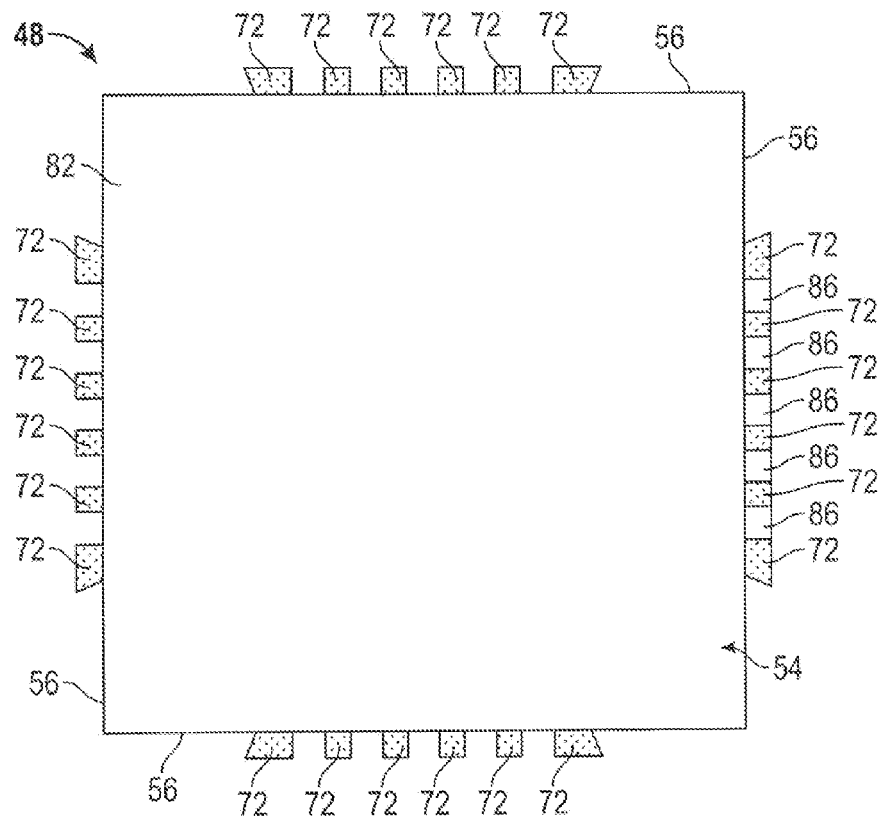
Figure 14:
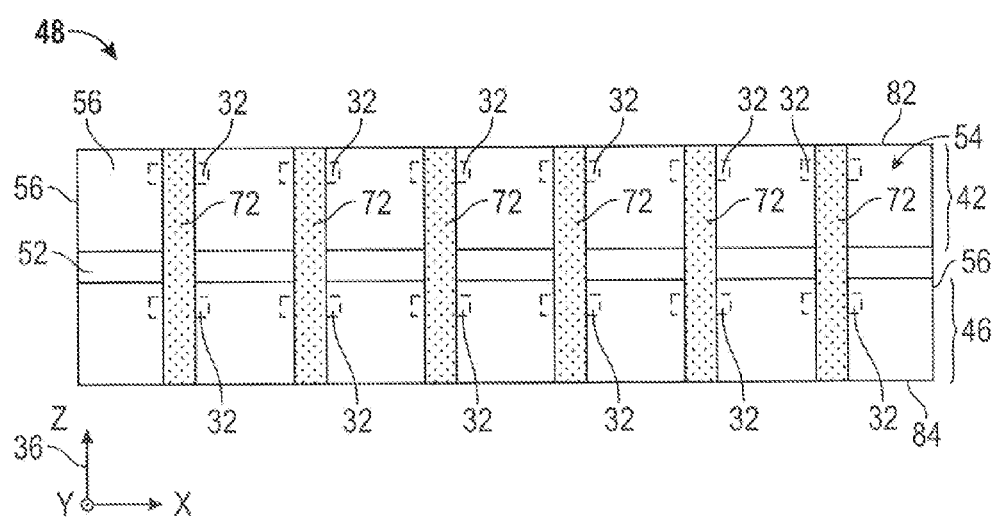

To complete exemplary method 20 (FIG. 1), spaced package array 64 is separated or singulated into a number of completed stacked microelectronic packages (STEP 78, FIG. 1). FIGS. 13 and 14 are top-down and side views, respectively, of a stacked microelectronic package 48 produced pursuant to singulation of spaced package array 64. Singulation may be carried-out utilizing laser cutting, mechanical sawing, scribing with punching, or another separation process. Singulation further removes the conductive material joining the sidewall-conductors of neighboring packages and, thus, fully defines (in combination with the formation of openings 76 shown in FIG. 12) electrically-isolated sidewall conductors 72, which may interconnect embedded microelectronic devices 28 by way of package edge conductors 32, as described below. If laser cutting, mechanical sawing, or another material removal process is employed, the cuts created by such a process are preferably formed to have a predetermined uniform width (identified in FIG. 12 as "$W_1$"), which is less than the package-to-package spacing in array 64 (again, identified in FIGS. 9 and 11 as "$S_1$"). The thickness of the sidewall conductors will generally be equivalent to one half the difference between $S_1$ and $W_1$. Additional processing steps may be also carried-out immediately prior to or after singulation of the spaced package array to complete the production of stacked microelectronic package 48. For example, if not already formed, a BGA, lead array, or similar contact formation may be formed over a surface of stacked microelectronic package 48.

With continued reference to FIGS. 13 and 14, stacked microelectronic package 48 includes two overlying packages or package layers 42 and 46, which each contain at least one embedded microelectronic device (e.g., devices 28 shown in FIGS. 5, 7, and 10). Each package layer 42, 46 also includes a number of package edge conductors 32 (physically covered in FIG. 14 and thus illustrated in phantom) extending to the illustrated vertical package sidewall 56 to contact different ones of package edge conductors 32. Package edge conductors 32 are advantageously formed to interconnect the microelectronic devices embedded within package layers 42 and 46. Although not shown in FIGS. 13 and 14 for clarity, package edge conductors 32 may also interconnect the microelectronic device or devices embedded within lower package layer 46 to a contact formation formed over the upper surface of upper package layer 42. Package edge conductors 32 extend from the topside or uppermost edge 82 of package body 54 to the bottom side or lowermost edge 84 of package body 54. In the illustrated example, sidewall conductors 72 have substantially linear, elongated geometries and are laterally spaced apart to interconnect different overlying or vertically-aligning pairs of package edge conductor 32; however, sidewall conductors 72 can be imparted with other geometries (e.g., L-, U-, W-, and block-shaped geometries) in alternative embodiments by limiting the penetration depth of selected ones of openings 76 described above in conjunction with FIG. 12. Furthermore, sidewall conductors 72 can also be formed to extend along non-vertical (e.g., oblique) axes by varying the direction at which material is removed from (e.g., holes are drilled into) the electrically-conductive material deposited onto the package sidewall during STEP 74 of exemplary method 20 (FIG. 1).

In certain embodiments, a dielectric material may further be deposited on the vertical package sidewalls and in contact with the sidewall conductors 72 formed thereover. In this case, the dielectric material is preferably occupies the area between neighboring sidewall conductors 72. This may be accomplished by depositing dielectric material into the openings (e.g., the drill holes) created during the above-described material removal process carried-out during STEP 74 of exemplary method 20 (FIG. 1) and prior to the singulation process carried-out during STEP 78. The dielectric material may then be cut so as to be flush with the sidewall interconnects during the singulation process. In other embodiments, dielectric material may be deposited between, adjacent, and/or over sidewall conductors 72 after singulation. Various different dielectric materials suitable for this purpose are known; and various ones of the application techniques described above with the application of the flowable conductive material can be employed to deposit the dielectric including, for example, needle dispensing or screen-printing techniques. The deposition of such an dielectric material prevents or minimize dendritic growth that may otherwise occur due to surface migration of certain constituents (e.g., silver particles) included within the flowable conductive material from which the sidewall conductors are formed. In addition, the addition of such a dielectric material between the sidewall conductors may provide additional mechanical robustness and may be chosen to have better adhesive properties than the electrically-conductive material from which the sidewall conductors are formed. Applicants' FIG. 13 illustrates one side of stacked microelectronic package 48 (i.e., the rightmost side of package 48 in the illustrated orientation) as including such a dielectric material 86 deposited between neighboring package edge conductors 32.

Stacked microelectronic package 48 may differ structurally from certain known stacked microelectronic packages in at least one of several respects. First, at least in some embodiments, sidewall conductors 72 are composed or comprised of a flowable conductive material, such as a metal-containing epoxy or electrically-conductive paste of the type described above. Second, sidewall conductors 72 are formed directly on and intimately contact the package sidewalls and are not separated therefrom by, for example, a seed layer of the type commonly utilized in conjunction with conventional plating processes. Third, sidewall conductors 72 are laterally separated or spaced apart; and, in embodiments wherein mechanical drilling or routing is utilized to create openings 76 (FIG. 12) and portions of the package body are removed during the drilling process, concave or dish-shaped saw cuts (as viewed from a top-down or planform perspective, as shown most clearly in FIG. 12) may be created within the vertical package sidewall between conductors 72. Sidewall conductors 72 may be laterally separated by air gaps or, alternatively, dielectric material may be deposited between conductors 72 in the above-described manner.

The foregoing has thus described exemplary embodiments of a method for fabricating stacked microelectronic packages, which may overcome limitations associated with conventional PoP packaging approaches and other known packaging technologies of the type described above. Reductions in vertical package profile are achieved, at least in part, through the usage of uniquely-formed sidewall conductors, which eliminate or at least reduce the usage of BGAs or similar contact formations to interconnect overlying package layers and the microelectronic devices contained therein. The sidewall conductors formed pursuant to the above-described fabrication method may provide superior layer-to-layer interconnectivity between package layers as compared to BGAs and similar contact formations. The sidewall conductors also eliminate or reduce the need for through-package vias in embodiments wherein the conductors extend from the package topside to bottom side. In preferred embodiments, the fabrication method was utilized to form interconnections for a large number of stacked microelectronic packages utilizing an efficient and global material fill and patterning process. Overall, embodiments of the above-described fabrication method provide efficient, cost effective, reliable, and repeatable process for high density, miniaturized stacked microelectronic packages.

Embodiments of the above-described fabrication methods can also be described as providing electrically conductive circuit lines (referred to above as "sidewall conductors" or "sidewall interconnects") at the edge of stacked microelectronic packages. The electrically conductive circuit lines may be produced first applying an electrically conductive adhesive (ECA) onto the package edges or vertical sidewalls. The ECA may then be cured, if appropriate. A material removal process, such as a laser or mechanical drilling process, can then be utilized to drill holes down through the ECA and in between the edge pads (that is, the exposed terminal ends of the package edge conductors) to be connected. The ECA may then be separated or split along the package dicing streets using, for example, a mechanical sawing or dicing technique. This results in the formation of conductive interconnect lines on the edge of the stacked package, which may interconnect the microelectronic devices contained therein and/or interconnect the one or more of the microelectronic devices to contacts, such as solder balls or leads, included contact formation formed over a surface of the stacked microelectronic package.

In a further embodiment, the above-described fabrication method commences with the step of providing a partially-completed stacked microelectronic package including a package body having a vertical package sidewall, a plurality microelectronic devices embedded within the package body, and package edge conductors electrically coupled to the plurality of microelectronic devices and extending to the vertical package sidewall. The partially-completed stacked microelectronic package can be provided by independent fabrication, by purchase from a third party supplier, or by otherwise obtaining the microelectronic package. A flowable conductive material is applied over the vertical package sidewall and contacts the package edge conductors. Selected portions of the flowable conductive material are then removed to define, at least in part, electrically-isolated sidewall conductors interconnecting different ones of the package edge conductors to interconnect the plurality of microelectronic devices included within the stacked microelectronic package.

In a still further embodiment, the above-described fabrication method includes placing first and second partially-completed stacked microelectronic packages in a side-by-side relationship, such as any neighboring pair of packages included within array 64 shown in FIGS. 9 and 10. The first partially-completed stacked microelectronic package has a first sidewall through which at least one electrically-conductive element (e.g., at least one package edge conductors) is exposed. Similarly, the second partially-completed stacked microelectronic package has a second sidewall through which at least one electrically-conductive element (e.g., at least one package edge conductor) is exposed. The first and second sidewalls separated by a gap (e.g., a segment of an alley 66 shown in FIGS. 9 and 10) when the first and second packages are placed in the side-by-side relationship. A body of electrically-conductive paste or adhesive is dispensed or otherwise deposited into the gap such that the electrically-conductive adhesive contacts the electrically-conductive elements exposed through the first and second sidewalls. Openings are then drilled through the electrically-conductive paste body to define, in part, a plurality of electrically-isolated sidewall conductors contacting the electrically-conductive elements. The body of electrically-conductive paste is then split or divided using, for example, a mechanical sawing process to further define the plurality of electrically-isolated sidewall conductors and separate the first and second partially-completed stacked microelectronic packages.

The foregoing has also provided embodiments of a stacked microelectronic package including a plurality of overlying package layers. Each package layer includes, in turn, a package layer body, at least a first microelectronic device embedded in the package layer body, and a plurality of package edge conductors extending from the first microelectronic device to a sidewall of the package body. The plurality of package edge conductors extend to the sidewall of the package layer body. A plurality of sidewall conductors, which comprise a flowable conductive material, are deposited on at least one sidewall of the package layer body such that each sidewall conductor is in ohmic contact with at least one package edge conductor. The plurality of sidewall conductors extend from an upper edge portion of the stacked microelectronic package to a lower edge portion thereof.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A stacked microelectronic package, comprising:
   first and second package layers bonded in a stacked relationship, each package layer comprising:
   a molded package layer body;
   a microelectronic device embedded within the molded package layer body; and
   package edge conductors electrically coupled to the microelectronic device and extending to at least one sidewall of the package layer; and
   a plurality of sidewall conductors electrically coupled to the package edge conductors and electrically interconnecting the microelectronic devices within the upper and lower package layers, the plurality of sidewall conductors composed of an electrically-conductive material deposited on sidewalls of the first and second package layers and having openings extending vertically therethrough electrically isolating adjacent ones of the sidewall conductors.

2. The stacked microelectronic package of claim 1 wherein the electrically-conductive material comprises a metal-containing epoxy.

3. The stacked microelectronic package of claim 1 further comprising a contact formation disposed over the first package layer and electrically coupled to at least one microelectronic device contained within the second package layer through at least one of the plurality of sidewall conductors.

4. The stacked microelectronic package of claim 1 wherein at least one of the first package layer and the second package layer comprises a redistributed chip panel package layer.

5. The stacked microelectronic package of claim 1 wherein the plurality of sidewall conductors have substantially linear shapes.

6. The stacked microelectronic package of claim 5 wherein the plurality of sidewall conductors are vertically oriented.

7. The stacked microelectronic package of claim 1 wherein the plurality of sidewall conductors interconnect different vertically-aligning pairs of the package edge conductors.

8. The stacked microelectronic package of claim 1 further comprises a dielectric material deposited onto sidewalls of the first and second package layers, the dielectric material filling the space between the plurality of sidewall conductors.

9. The stacked microelectronic package of claim 1 wherein the openings extend into the first and second package layers at locations between the plurality of sidewall conductors as viewed from a side of the stacked microelectronic package, and wherein the openings have concave geometries as viewed from a top-down perspective.

10. A stacked microelectronic package, comprising:
    a plurality of package layers laminated together in a stacked formation to yield a stacked microelectronic package having a vertical sidewall, each package layer comprising:
    a molded package layer body;
    a microelectronic device embedded within the molded package layer body; and
    package edge conductors extending from the microelectronic device to the vertical sidewall;
    a plurality of sidewall conductors formed over the vertical package sidewall, the plurality of sidewall conductors composed of an electrically-conductive material applied on the vertical package sidewall, contacting the package edge conductors, and having vertical openings formed therein electrically isolating adjacent sidewall conductors.

11. The stacked microelectronic package of claim 10 wherein, for each package layer, the molded package layer body comprises a singulated piece of a larger molded panel.

12. The stacked microelectronic package of claim 10 wherein the vertical openings comprise at least one row of vertical openings drilled through the electrically-conductive material.

13. The stacked microelectronic package of claim 10 wherein the electrically-conductive material comprises an electrically-conductive paste.

14. The stacked microelectronic package of claim 10 wherein the vertical openings extend into the vertical sidewall of the stacked microelectronic package.

15. The stacked microelectronic package of claim 10 wherein the plurality of sidewall conductors each have substantially linear, elongated geometries.

16. The stacked microelectronic package of claim 15 wherein the plurality of sidewall conductors are each vertically oriented.

17. A stacked microelectronic package, comprising:
    an upper package layer;
    a lower package layer bonded to the upper package layer and cooperating therewith to define a vertical sidewall of the stacked microelectronic package;
    a first plurality of package edge conductors in the upper package layer and extending to the vertical sidewall;
    a second plurality of package edge conductors in the lower package layer and extending to the vertical sidewall;
    electrically conductive circuit lines formed on the vertical sidewall composed of an electrically conductive adhesive through which vertical openings are formed to electrically isolate neighboring ones of the electrically conductive circuit lines, the electrically conductive circuit lines interconnecting the first plurality of package edge conductors with the second plurality of package edge conductors.

18. The stacked microelectronic package of claim 17 further comprising a dielectric material deposited onto the vertical sidewall and into the vertical openings.

19. The stacked microelectronic package of claim 17 wherein the vertical openings extend into the vertical sidewall.

20. The stacked microelectronic package of claim 17 wherein the vertical openings comprise at least one row of vertical openings drilled through the electrically conductive adhesive.

* * * * *